US012733468B2

(12) United States Patent
Yang et al.

(10) Patent No.: US 12,733,468 B2
(45) Date of Patent: Sep. 8, 2026

(54) METAL STRUCTURES WITH SEAMS

(71) Applicant: Taiwan Semiconductor Manufacturing Company, Ltd., Hsinchu (TW)

(72) Inventors: Hao Yang, New Taipei City (TW); Sung-Hsun Wu, Kaohsiung (TW); Neng-Jye Yang, Hsinchu (TW); Jye-Yen Cheng, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 736 days.

(21) Appl. No.: 18/165,647

(22) Filed: Feb. 7, 2023

(65) Prior Publication Data

US 2024/0266216 A1 Aug. 8, 2024

(51) Int. Cl.

| | |
|---|---|
| ***H01L 21/768*** | (2006.01) |
| ***H10W 20/00*** | (2026.01) |
| ***H10W 20/42*** | (2026.01) |
| *H10W 20/41* | (2026.01) |
| *H10W 20/44* | (2026.01) |

(52) U.S. Cl.
CPC ....... *H10W 20/056* (2026.01); *H10W 20/033* (2026.01); *H10W 20/077* (2026.01); *H10W 20/42* (2026.01); *H10W 20/425* (2026.01); *H10W 20/4441* (2026.01)

(58) Field of Classification Search
CPC ......... H01L 21/76883; H01L 21/76834; H01L 21/76843; H01L 23/5226; H01L 23/53238; H01L 23/53257; H01L 21/76885; H01L 23/53295
See application file for complete search history.

(56) References Cited

U.S. PATENT DOCUMENTS 9,514,983 B2 12/2016 Jezewski et al.
2015/0365090 A1* 12/2015 Greene ................ H10N 70/841 326/41
2017/0213792 A1* 7/2017 Nag ...................... H10W 20/20

FOREIGN PATENT DOCUMENTS

CN 104813446 A 7/2015

* cited by examiner

*Primary Examiner* — Karen Kusumakar
(74) *Attorney, Agent, or Firm* — Ingrassia Fisher & Lorenz, LLP | IF&L

(57) ABSTRACT

Devices with metal structures formed with seams and methods of fabrication are provided. An exemplary method includes forming a metal plug having a top surface formed with a seam; depositing a film over the top surface of the metal plug and at least partially filling the seam; and etching the film from over the metal plug, wherein the film remains in the seam.

20 Claims, 9 Drawing Sheets

METAL STRUCTURES WITH SEAMS

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
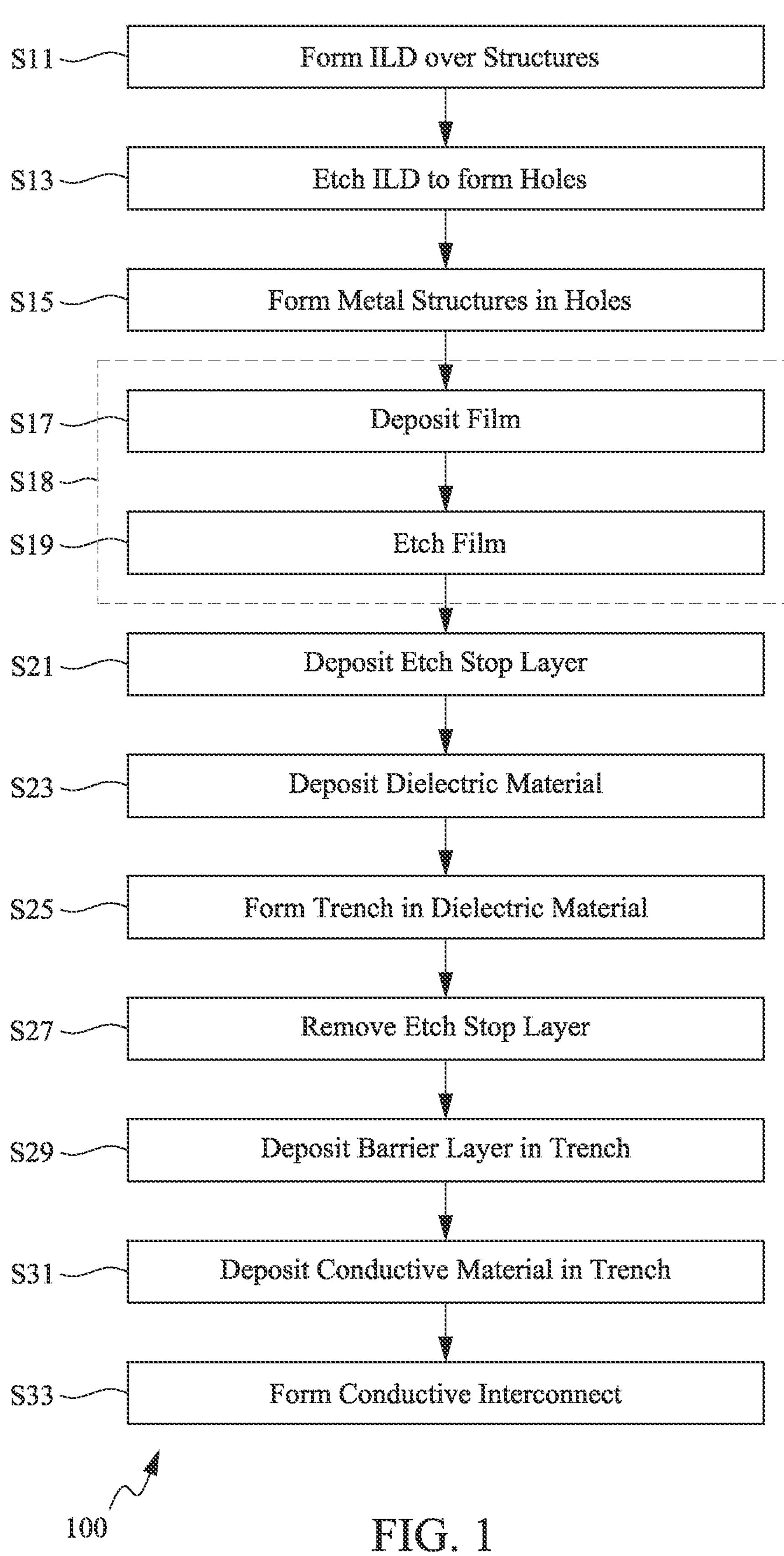
FIG. 1 is a flow chart illustrating a method, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over", "overlying", "above", "upper", "top", "under", "underlying", "beneath", "below", "lower", "bottom", "side", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In certain embodiments herein, a "material structure" is a structure that includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material; and a structure that is formed of a "material" includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material. For example, certain embodiments, each of a tungsten structure and a structure formed of tungsten is a structure that is at least 50 wt. %, at least 60 wt. %, at least 75 wt. %, at least 90 wt. %, at least 95 wt. %, or at least 99 wt. % of tungsten.

For the sake of brevity, typical techniques related to semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many typical processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

It is noted that this disclosure presents certain embodiments of metal structures in the form of conductive plugs, lines or vias. However, embodiments are not so limited.

Presented herein are embodiments of metal structures and of methods for fabricating metal structures and/or for fabricating semiconductor devices with metal structures. Methods described herein may be easily integrated into the current process flow. In certain embodiments, the metal structures are formed with a seam, or void, that is capped with a film. In exemplary embodiments, the metal structure is tungsten and the film is an oxide, nitride, oxynitride, or metal layer.

In advanced nodes, small holes may be filled with tungsten by a chemical vapor (CVD) process to produce tungsten plugs. However, tungsten does not grow well on the surface of holes. As a result, the tungsten plugs are formed with large seams. Tungsten plugs with seams are fragile and are easily damaged by other processes, such as dry etching and wet clean processes, which cause tungsten loss and seam enlargement. Tungsten loss and seam enlargement will cause yield loss, as the barrier layer of the interconnect structure formed over the metal structure is discontinuous. Because the barrier over the metal structure is discontinuous, the material of the interconnect structure, for example copper, formed above the metal structure may fill the seam.

Herein, embodiments may minimize metal loss and seam enlargement. Further, embodiments herein may protect metal structures from damage from dry etching. Also, embodiments herein may protect metal structures from dissolution or corrosion from wet etching or cleaning processes.

Embodiments of the present disclosure offer advantages over the existing art, though it is understood that other embodiments may offer different advantages, not all advantages are necessarily discussed herein, and no particular advantage is required for all embodiments. Certain embodiments herein use a thin film to fill seams in metal structures to protect the metal structures from damage, dissolution, and/or corrosion from dry or wet processes. In exemplary embodiments, the film fills the seams and forms a protective layer around the metal structure, preventing damage from dry etching and wet processes.

Certain embodiments herein use a wet process to etch back the thin film such that the film remains only in the seam and on the sidewall of the metal structure. In certain embodiments, the film filling the seam prevents an overlying etch stop layer or conductive material from dropping into the seam. Certain embodiments provide metal structures with resistance to damage by dry etching. Certain embodiments provide for reduced metal loss in metal structures and for reduced seam enlargement in metal structures having seams during later processing. In certain embodiments, the thin film on the sidewall of metal structures prevents current leakage.

For purposes of the discussion that follows, FIG. 1 provides a flow chart for a method 100 for fabricating a semiconductor device 10 during a semiconductor fabrication process. Method 100 is described below with reference to FIGS. 2-9 which illustrate the semiconductor device 10 at various stages of fabrication according to method 100. FIGS. 2-9 are cross-sectional views in which the vertical direction is defined by the Z-axis and the lateral direction is defined by the X-axis. It is understood that method 100 includes steps having features of a complementary metal-oxide-semiconductor (CMOS) technology process flow and thus, are only described briefly herein. Also, additional steps may be performed before, after, and/or during method 100.

Figure 2:
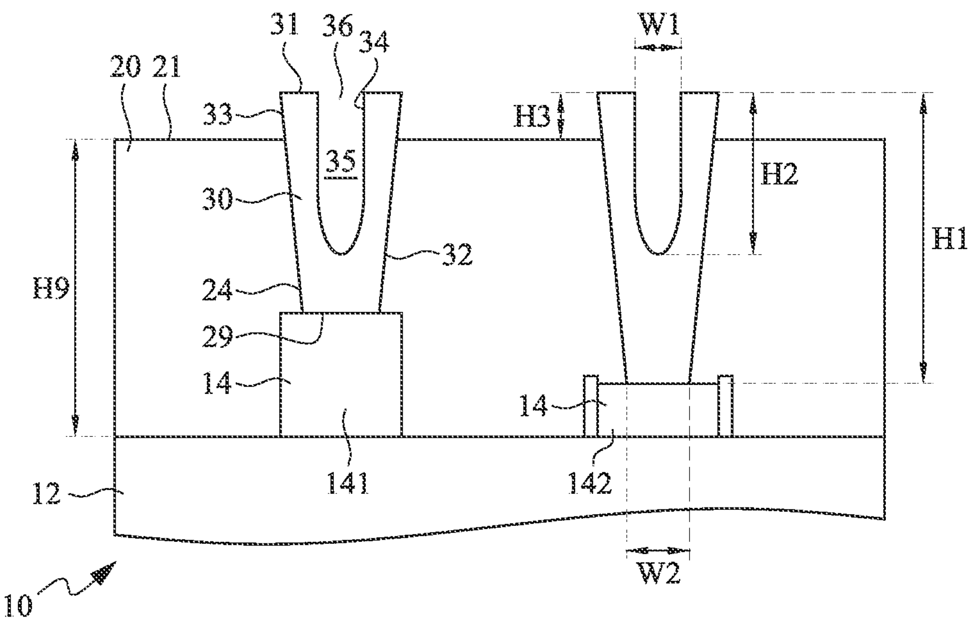
FIGS. 2-9 are cross-sectional views of a device during successive stages of fabrication of the method of FIG. 1, in accordance with some embodiments.

Referring now to FIGS. 1 and 2, a method 100 for fabricating a semiconductor device 10 includes, at S11, depositing an interlayer dielectric (ILD) material 20 over conductive structures 14 and/or over a substrate 12. As shown, ILD material 20 has an uppermost surface 21. Method 100 also includes, at S13, etching the ILD material 20 to form holes 24 aligned with the structures 14. An exemplary ILD material 20 is $SiO_2$. Exemplary conductive structures 14 include metal contacts 141 to active regions and metal gates 142.

In an exemplary embodiment, the ILD material 20 has a vertical height or thickness H9. In exemplary embodiments, the ILD thickness H9 is from 30 to 70 nanometers (nm).

Further, method 100 includes, at S15, forming metal structures 30 in the holes 24. The metal structures 30 maybe plugs, conductive vias, or other metal features. In exemplary embodiments, the metal structures 30 are formed with a top surface 31 that terminates at opposite sidewalls 32. As shown, the top surface 31 is formed at a vertical height H3 above the uppermost surface 21 of the ILD material 20. Thus, a portion 33 of the sidewalls 32 are located above the uppermost surface 21 of the ILD material 20. In exemplary embodiments, the vertical height H3 of the portions 33 of sidewalls 32 is from 0.1 to 3 nanometers (nm).

As shown, each metal structure 30 has a bottom surface 29 and a vertical height H1 extending from the top surface 31 to the bottom surface 29. In exemplary embodiments, vertical height H1 may be from 20 to 50 nanometers (nm), for metal structures 30 located over a metal contact 141 to an active region, or from 30 to 50 nanometers (nm), for metal structures 30 located over a metal gate 142. In an exemplary embodiment, the bottom surface 29 of each metal structure 30 has a lateral width W2. In exemplary embodiments, the bottom width W2 is from 5 to 20 nanometers (nm).

In exemplary embodiments, the metal structures 30 are formed by a metal deposited by atomic layer deposition (ALD), chemical vapor deposition (CVD), or physical vapor deposition (PVD) over a barrier layer (not shown), such as a Ti/TiN barrier layer. In an exemplary embodiment, the barrier layer has a thickness of from 0.1 to 3 nanometers (nm). As a result of the deposition process, in which the metal structures grow upward and inward from the opening surfaces, the metal structures 30 are formed with a seam or central void 35 that extends vertically, i.e., in the direction of the Z-axis, from an opening 36 in the top surface 31 into the metal structure 30, for a vertical depth H2. As shown, each seam 35 is defined by an internal sidewall or sidewalls 34 of the metal structures 30. In exemplary embodiments, the seam depth H2 is from 5 to 50 nanometers (nm). In exemplary embodiments, the seam 35 has a lateral width W1, i.e., in the direction of the X-axis extending between opposite internal sidewalls 34. In exemplary embodiments, the seam width W1 is from 0.1 to 5 nanometers (nm).

The metal structure 30 may be comprised of any suitable metal. In exemplary embodiments, the metal structure 30 is comprised of tungsten.

Figure 3:
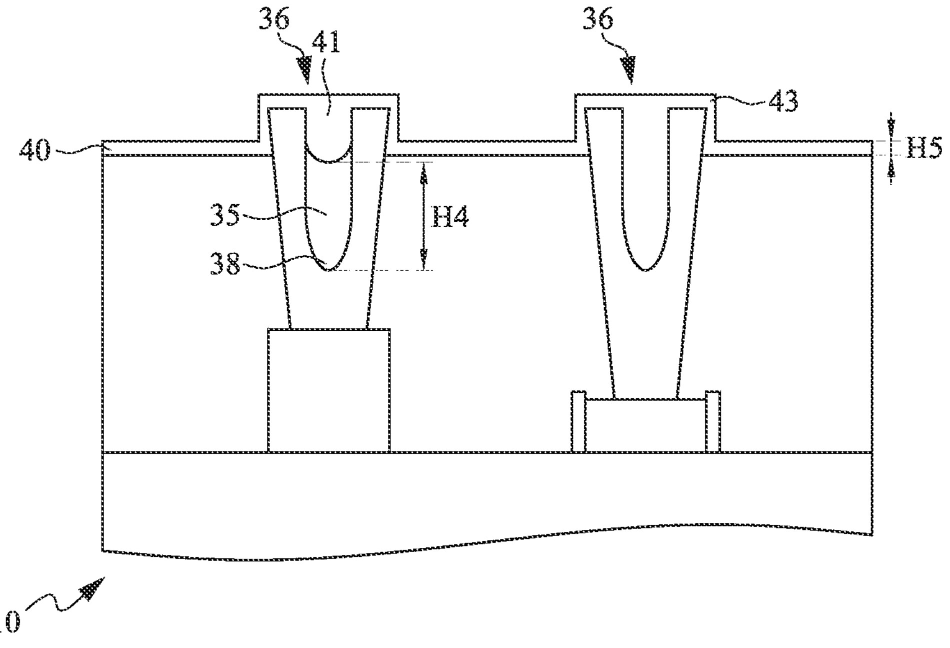

Cross-referencing FIGS. 1 and 3, method 100 includes, at S17, depositing a film 40 over the structure of the semiconductor device 10. For example, the film 40 may be deposited over the uppermost surface 21 of the ILD material 20. Further, the film 40 may be deposited over the exposed portions 33 of sidewalls 32, over the top surface 31, and in the seam 35 of the metal structure 30. Thus, the film 40 includes a cap 41 that fills the seam 35 and a sidewall portion 43 adjacent to the exposed portions 33 of sidewalls 32.

In certain embodiments, the cap 41 completely fills the seam 35, as shown in the metal structure 30 overlying the metal gate 142. In certain embodiments, the cap 41 partially fills the seam 35, such that an air gap 38 is located in the seam 35 under the cap 41, as shown in the metal structure 30 overlying the metal contact 141. In exemplary embodiments, the air gap 38 has a vertical height H4 of from 4 to 49 nanometers (nm). In exemplary embodiments, whether the cap completely fills the seam 35 or whether an air gap 38 is located under the cap 41, the cap 41 completely seals the opening 36. Specifically, the cap 41 forms a complete and continuous contact with the internal sidewall 34 at the opening 36.

In an exemplary embodiment, the film 40 has a thickness H5. In exemplary embodiments, the thickness H5 is from 10 to 100 Angstrom.

In exemplary embodiments, the film 40 is comprised of an oxide, nitride, oxynitride, or metal layer. In an exemplary embodiment, the film is $Al_2O_3$.

Figure 4:
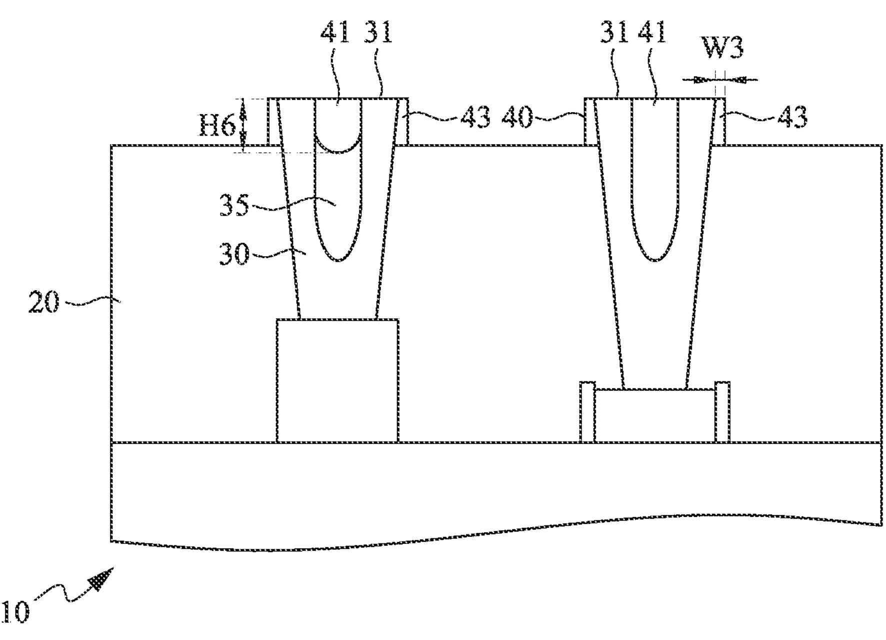

Cross-referencing FIGS. 1 and 4, method 100 includes, at S19, etching film 40. Specifically, the method 100 etches the film 40 from over the metal structures 30 to uncover the top surface 31. The top surface 31 is uncovered to allow for conductive contact with an overlying metal layer as described below.

In exemplary embodiments, the cap 41 formed by the film 40 remains in the seam 35 after etching. In exemplary embodiments, the cap 41 has a maximum vertical height H6 of from 1 to 20 nanometers (nm). In certain embodiments, the cap 41 fills the hole such that the maximum vertical height H6 is equal to the trench depth H2. Generally, the sum of the cap height H6 and the air gap height H4 (which may be zero) is equal to the seam depth H2.

Further, the vertical sidewall portions 43 may remain adjacent to the metal structure 30 after etching. In the illustrated embodiment of FIG. 4, the film 40 on the ILD material 20, other than the vertical sidewall portions 43, is removed by the etching process. In an exemplary embodiment, the vertical sidewall portions 43 have a lateral thickness W3. In exemplary embodiments, the sidewall portion thickness W3 is from 0.1 to 1 nanometers (nm).

In exemplary embodiments, the film 40 is etched by a wet etching process. An exemplary wet etching process is performed with HF, $NH_4F$, $H_3PO_4$, $H_2O$, or molecules containing F or P. In exemplary embodiments, the wet etching process is performed with HF, $NH_4F$, $H_3PO_4$, $H_2O$, or molecules containing F or P as an etching medium; with pure $H_2O$, $H_2O$ with $CO_2$, or $H_2O$ with dilute $NH_4$ OH as a cleaning medium; with a drying process selected from spin drying with $N_2$ gas or IPA drying; and with a process temperature of from 20 to 80 degrees C.

In method 100, S17 and S19 may be considered to collectively seal the seam 35 with a cap 41 at S18. Thus, action S18 includes depositing the film 40 over the top surface 31 of the metal structure 30 and at least partially filling the seam 35, and etching the film 40 from over the metal structure 30, wherein the cap 41 of the film 40 remains in the seam 35.

It is noted that the cap 41 and the sidewall portion 43 of the film 40 protect the surfaces of the metal structures 30 that are not purposely uncovered, i.e., the surfaces other than the top surface 31, from damage during the wet etching process.

Figure 5:
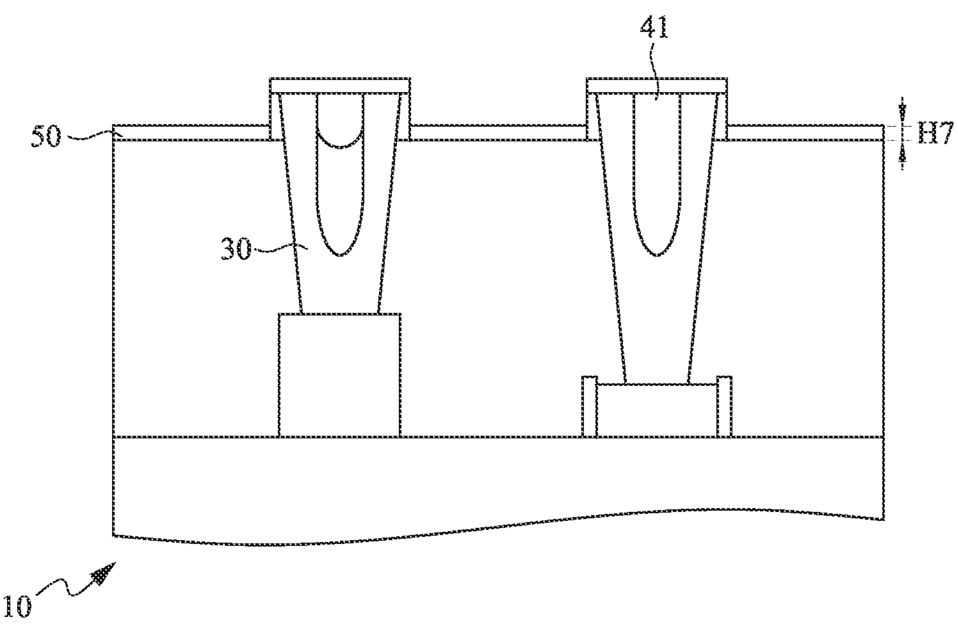

Cross-referencing FIGS. 1 and 5, method 100 may continue at S21 with depositing an etch stop layer 50 over the metal structure 30 and cap 41. An exemplary etch stop layer 50 comprises SiN, SiC, tetraethyl orthosilicate (TEOS), other insulating materials, or combinations thereof. Alternatively, the etch stop layer 50 may comprise other materials.

In an exemplary embodiment, the etch stop layer 50 has a thickness H7. In exemplary embodiments, the thickness H7 is from 0.1 to 3 nanometers (nm).

Because the cap 41 seals the opening 36 of each metal structure 30, the etch stop layer 50 may be formed continuously over the seam 35 and further completely cover the seam 35.

Figure 6:
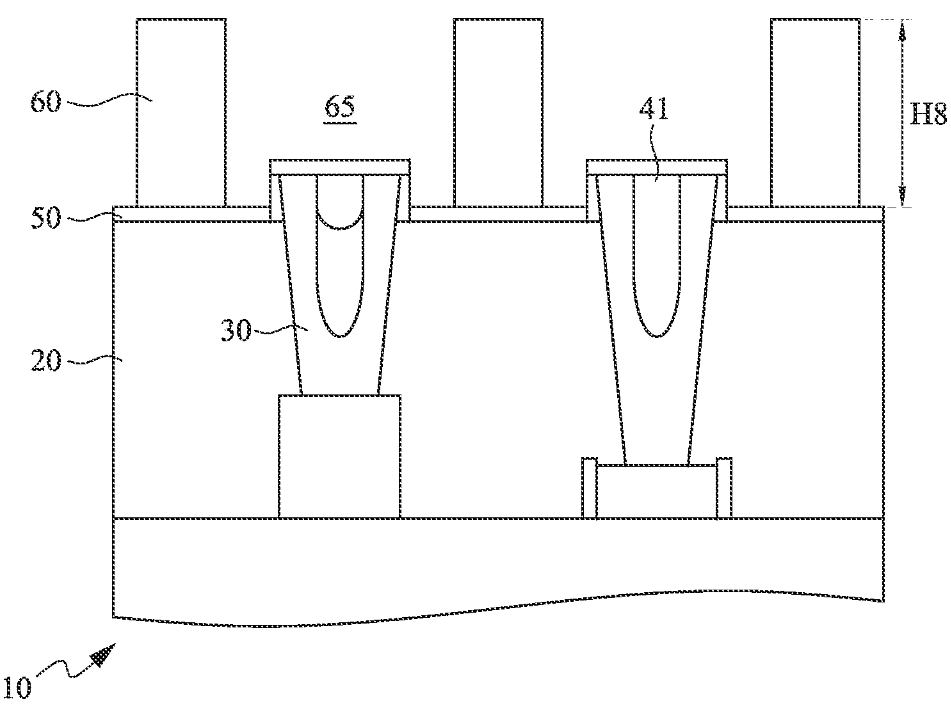

Cross-referencing FIGS. 1 and 6, method 100 may continue at S23 with forming a dielectric material 60 over the metal structure 30, the cap 41, and the etch stop layer 50. An exemplary dielectric material 60 is a low-k material. In an exemplary embodiment, the dielectric material 60 has a vertical height or thickness H8. In exemplary embodiments, the dielectric thickness H8 is from 20 to 50 nanometers (nm). Further, method 100 includes, at S25, etching the dielectric material 60 over the metal structure 30 to form a trench 65. For example, the dielectric material 60 may be patterned and etched during back-end-of-line (BEOL) patterning. In exemplary embodiments, a dry etching process is used to etch the dielectric material 60 to form the trench 65.

As shown, while etching the dielectric material 60 over the metal structure 30 to form trench 65, the etch stop layer 50 protects the ILD material 20 and the metal structure 30 from damage from the etchant. Specifically, because the etch stop layer 50 completely and continuously covers the top surface 31 and seam 35 of each metal structure 30, the top surface 31 of each metal structure 30 is protected from the dry etching process.

Likewise, the cap 41, lying under the etch stop layer 50, and the sidewall portion 43 of the film 40 protect the metal structure 30 from damage from the dry etchant. In particular, the cap 41 and the sidewall portion 43 of the film 40 protect the surfaces of the metal structures 30 that were not purposely uncovered, i.e., the surfaces other than the top surface 31, from damage during the wet etching process, including the portion 33 of the sidewalls 32 are located above the uppermost surface 21 of the ILD material 20 and the internal sidewalls 34 that bound the seams 35.

Thus, by sealing the seam 35 of each metal structure 30, the method is able to provide an etch stop layer 50 that completely and continuously covers the top surface 31 and seam 35 of each metal structure 30. In this manner, each metal structure 30 is protected from damage from the wet etchant and the dry etchant in the previously described etching processes.

Figure 7:
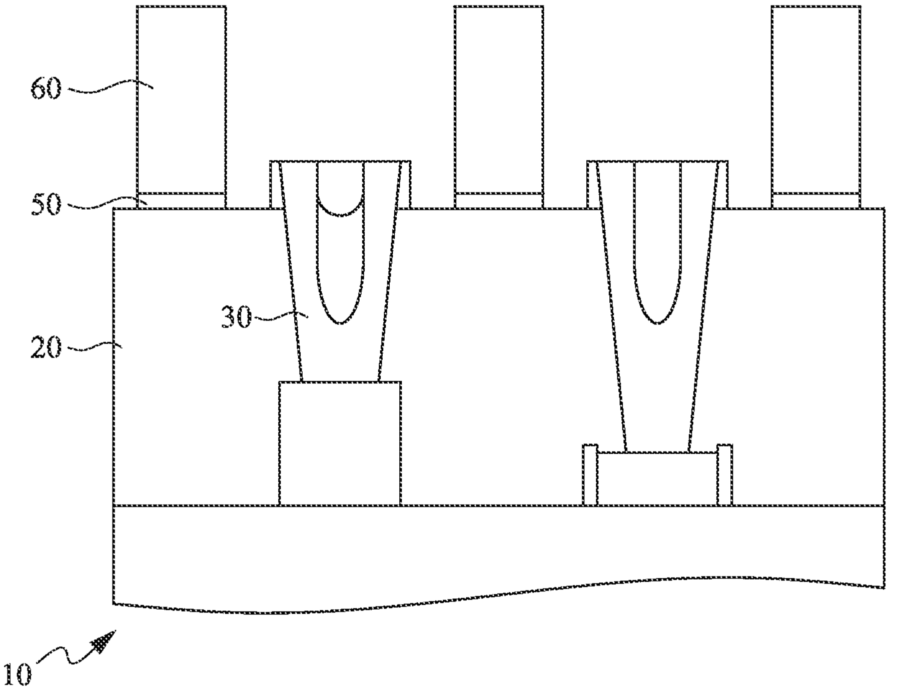

Cross-referencing FIGS. 1 and 7, method 100 may continue at S27 with removing the etch stop layer 50 from over the metal structure 30. Specifically, the portions of the etch stop layer 50 that are not covered by the dielectric material 60 are removed. Thus, the etch stop layer 50 is removed from the metal structure 30 and from the ILD material 20 under the trench 65. In exemplary embodiments, a wet clean process is further performed to remove dry residue from the trench etching process and to remove the etch stop layer. In exemplary embodiments, the wet etch process is performed with a solution containing $H_2O$ and $NH_4F$, or other suitable chemistries.

Figure 8:
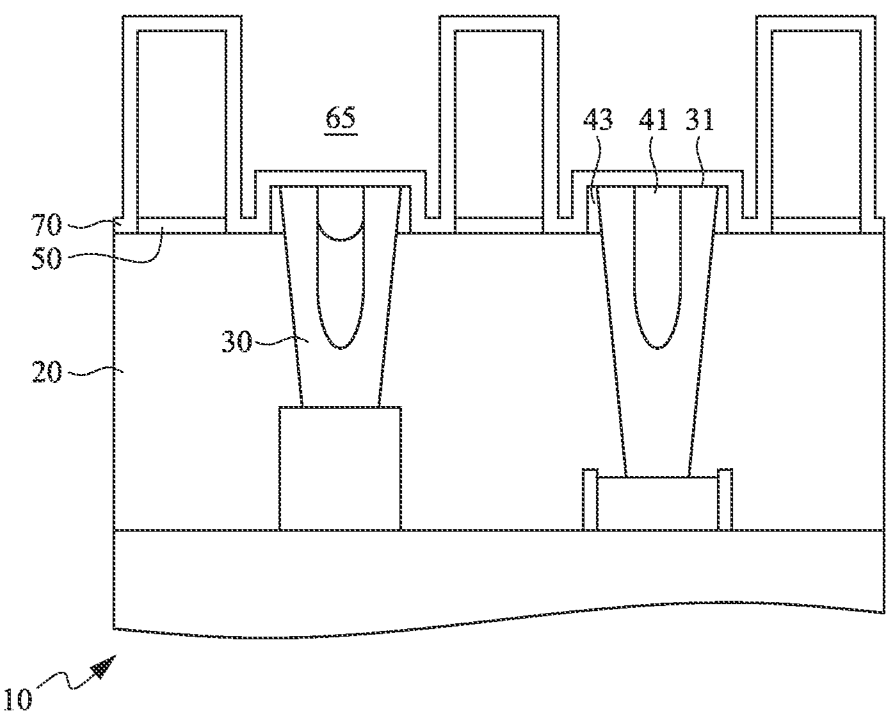

Cross-referencing FIGS. 1 and 8, method 100 may continue at S29 with depositing a barrier layer 70 in the trench 65. Specifically, the barrier layer 70 is conformally deposited over the dielectric material 60, the sidewalls of the trench 65 defined by the dielectric material 60 and etch stop layer 50, over the ILD material 20, over the sidewall portions 43, over the cap 41, and over the top surface 31 of the metal structure 30. An exemplary barrier layer 70 is TaN or TiN, though other suitable materials may be used.

Figure 9:
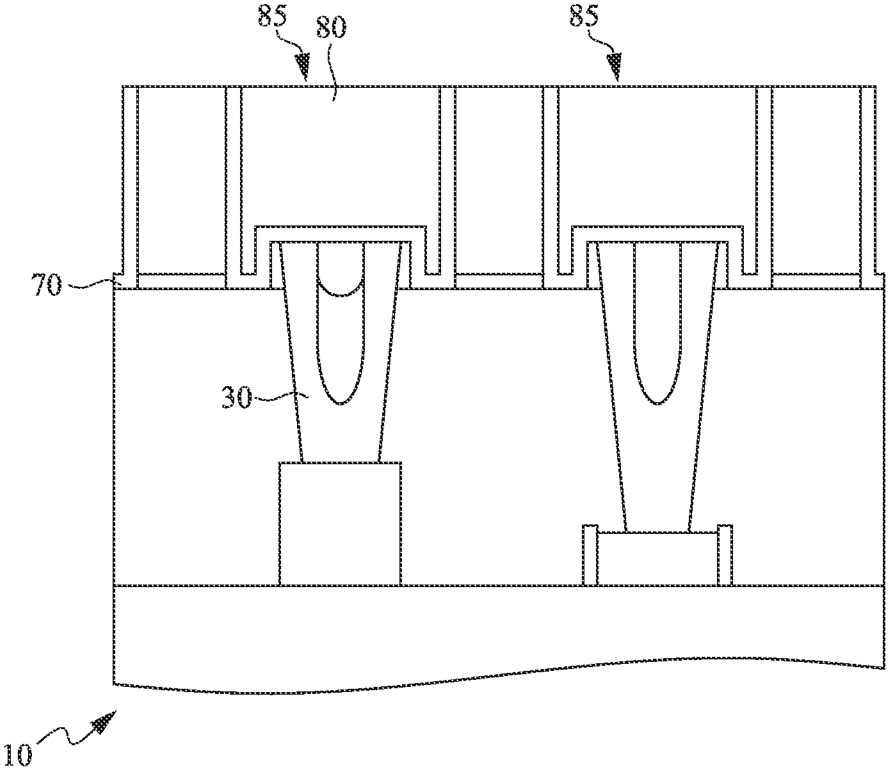

Cross-referencing FIGS. 1 and 9, method 100 may continue at S31 with depositing a conductive material 80 in the trench 65. In exemplary embodiments, the conductive material 80 is a metal, such as copper. Further, method 100 may include, at S33, planarizing the semiconductor device structure 10 to define separate conductive interconnects 85 as shown, with each in contact with an underlying metal structure 30.

Method 100 as described in relation to FIGS. 1-9 forms the conductive interconnect structure 10 of FIG. 9.

Figure 10:
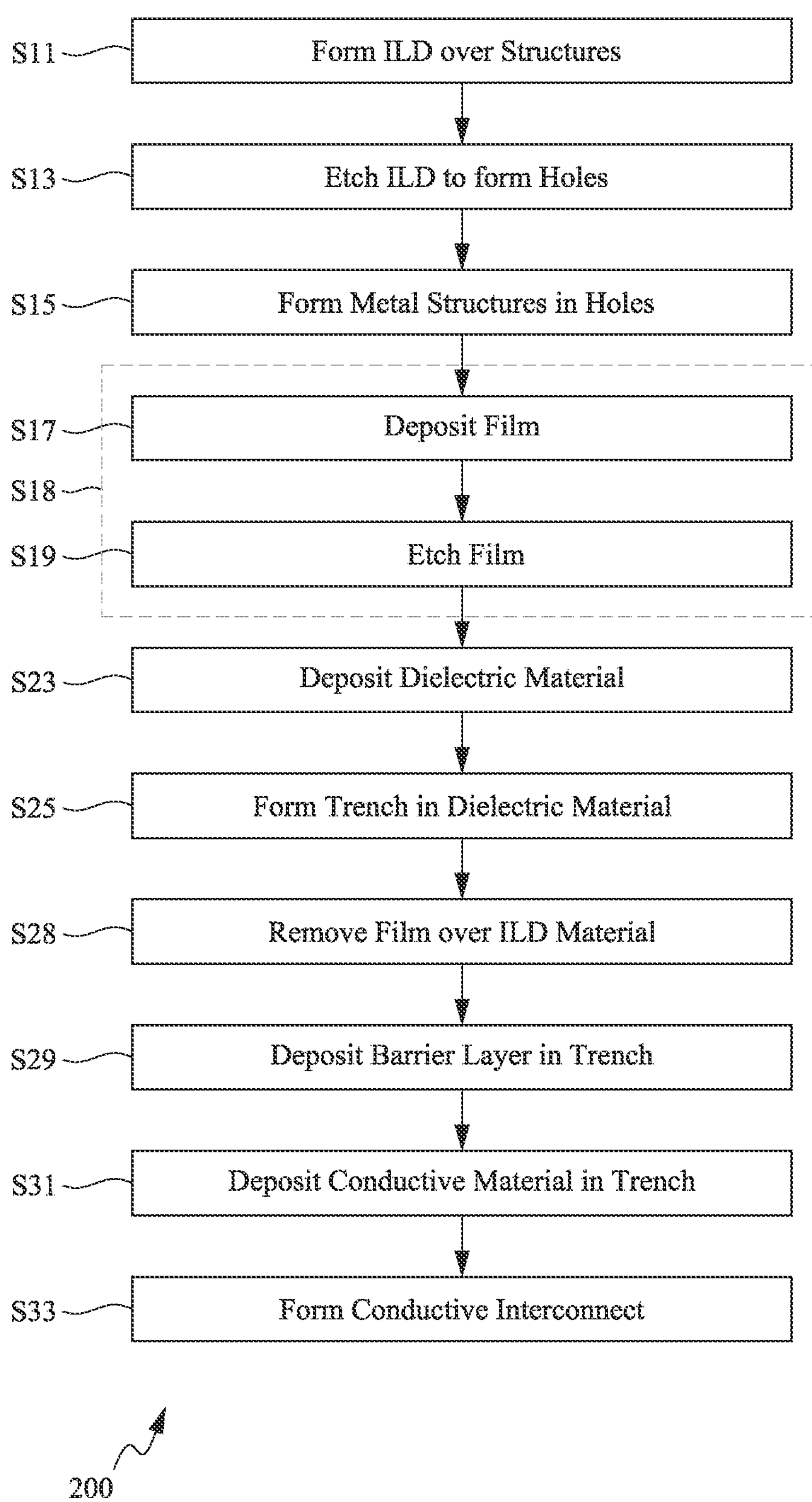
FIG. 10 is a flow chart illustrating a method, in accordance with some embodiments.

FIG. 10 provides a flow chart of a method 200 for fabricating a semiconductor device 10 during a semiconductor fabrication process. In the embodiment of method 200, after etching the film from over the metal structure, the film remains covering the dielectric layer.

Method 200 is described below with reference to FIGS. 2-3 and 11-15 which illustrate the semiconductor device 10 at various stages of fabrication according to method 200. FIGS. 2-3 and 11-15 are cross-sectional views in which the vertical direction is defined by the Z-axis and the lateral direction is defined by the X-axis. It is understood that method 200 includes steps having features of a complementary metal-oxide-semiconductor (CMOS) technology process flow and thus, are only described briefly herein. Also, additional steps may be performed before, after, and/or during method 200.

As previously described with reference to method 100 and FIGS. 2-3, method 200 for fabricating a semiconductor device 10 also includes, at S11, depositing an interlayer dielectric (ILD) material 20 over conductive structures 14 and/or over a substrate 12; at S13, etching the ILD material 20 to form holes 24 aligned with the structures 14; at S15, forming metal structures 30 in the holes 24; and at S17, depositing a film 40 over the structure of the semiconductor device 10.

Figure 11:
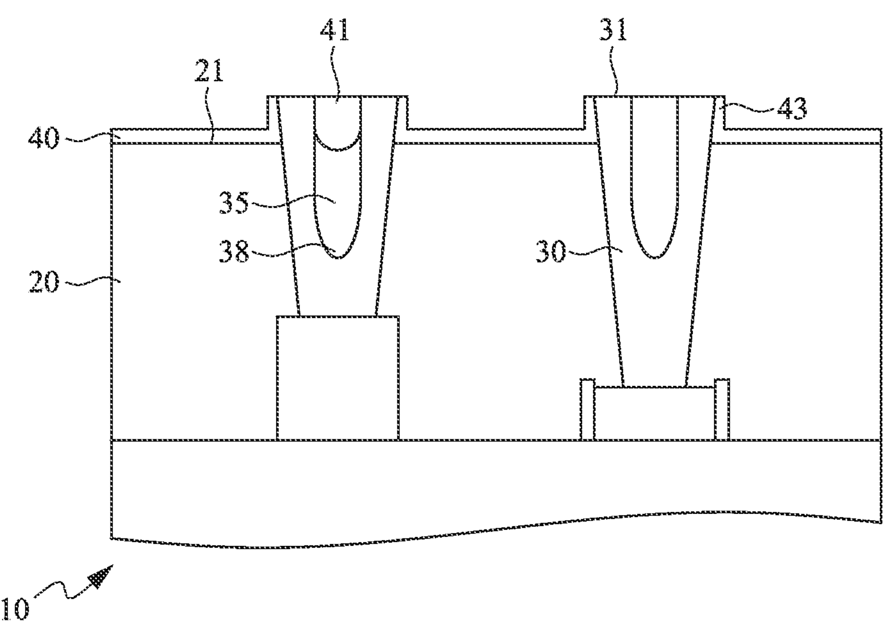
FIGS. 11-15 are cross-sectional views of a device during successive stages of fabrication of the method of FIG. 10, in accordance with some embodiments.

Cross-referencing FIGS. 10 and 11, method 200 includes, at S19, partially etching film 40. Specifically, the method 200 etches the film 40 from over the metal structures 30 to uncover the top surface 31. Unlike the embodiment of FIGS. 1-9, in method 200, the film 40 is not removed from over the uppermost surface 21 of the ILD material 20. Rather, the film 40 is removed only from over the metal structure 30 in method 200. The film 40 over the uppermost surface 21 of the ILD material 20 may be thinned. Thus, film 40 covers the ILD material 20 and the interface between the ILD material 20 and the metal structure 30.

In method 200, S17 and S19 may be considered to collectively seal the seam 35 with a cap 41 at S18. Thus, action S18 includes depositing the film 40 over the top surface 31 of the metal structure 30 and at least partially filling the seam 35, and etching the film 40 from the top surface 31 of the metal structure 30, wherein the film 40 remains in the seam 35 (as cap 41) as well as over the ILD material 20 between metal structures 30.

Figure 12:
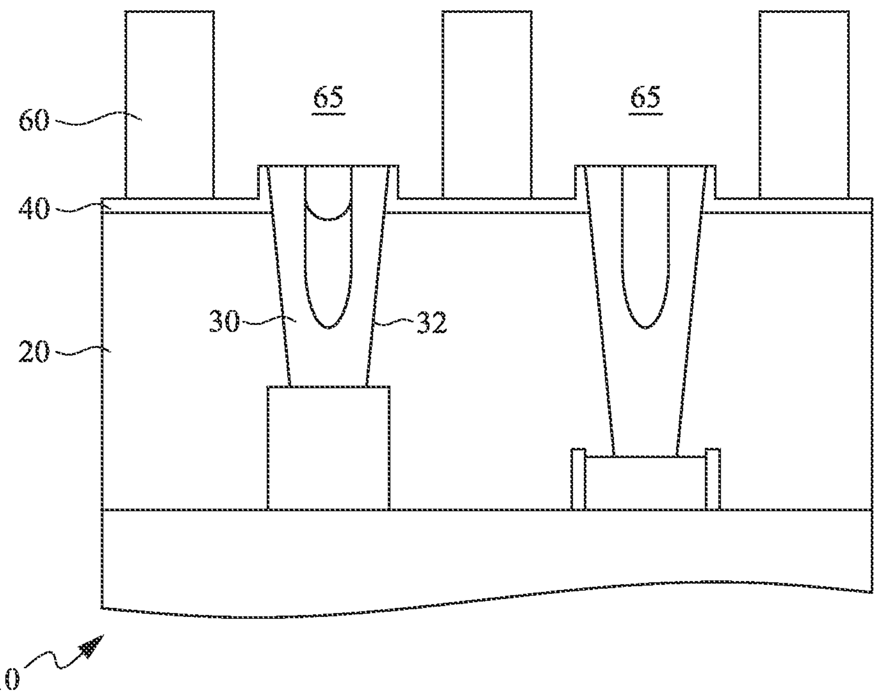

Cross-referencing FIGS. 10 and 12, method 200 may continue at S23 with forming a dielectric material 60 over the metal structure 30, the cap 41, and the film 40. Further, method 200 includes, at S25, etching the dielectric material 60 over the metal structure 30 to form a trench 65. For example, the dielectric material 60 may be patterned and etched during back-end-of-line (BEOL) patterning. In exemplary embodiments, a dry etching process is used to etch the dielectric material 60 to form the trench 65. As shown, while etching the dielectric material 60 over the metal structure 30 to form trench 65, the film 40 prevents etching of the ILD material 20 and may protect the metal structure 30 from damage from the etchant along the sidewalls 32.

Figure 13:
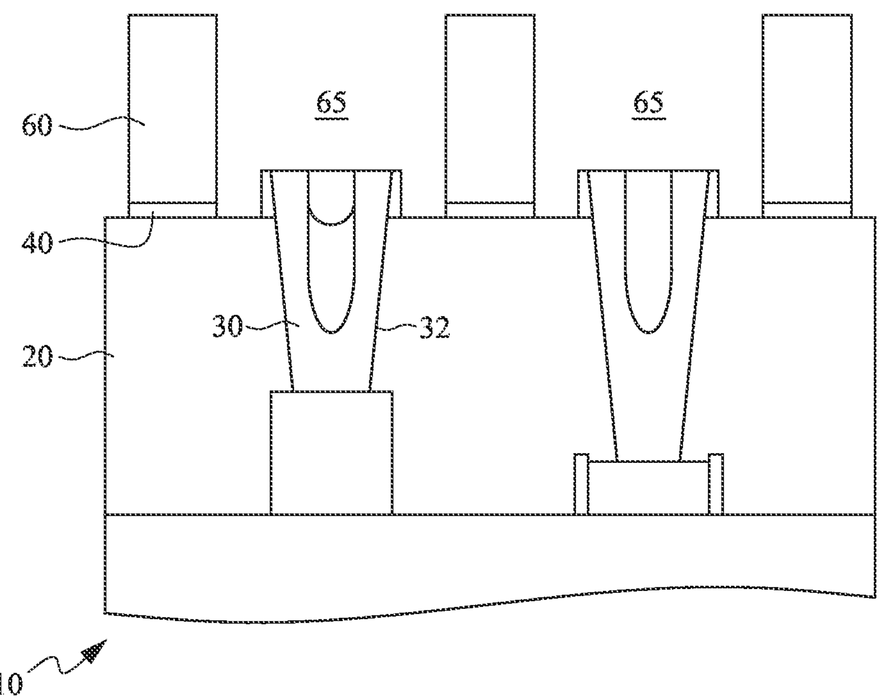

Cross-referencing FIGS. 10 and 13, method 200 may continue at S28 performing a wet cleaning process, such as for removing dry residue from the dry etching process. An exemplary process removes the film 40 from the ILD material 20. The sidewall portions 43 may remain adjacent to the metal structure 30. In exemplary embodiments, the wet etch process is performed with a solution containing $H_2O$ and $NH_4F$, or other suitable chemistries.

Figure 14:
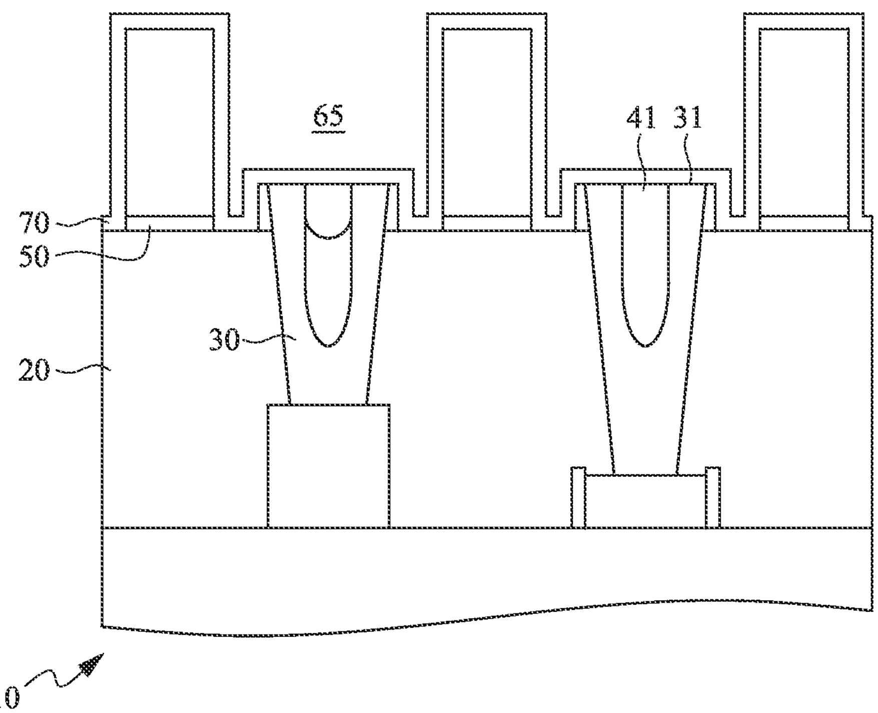

Cross-referencing FIGS. 10 and 14, method 200 may continue at S29 with depositing a barrier layer 70 in the trench 65. An exemplary barrier layer 70 is conformally deposited over the dielectric material 60, the sidewalls of the trench 65 defined by the dielectric material 60 and film 40, over the sidewall portions 43, over the cap 41, and over the top surface 31 of the metal structure 30. An exemplary barrier layer 70 is TaN or TiN, though other suitable materials may be used.

Figure 15:
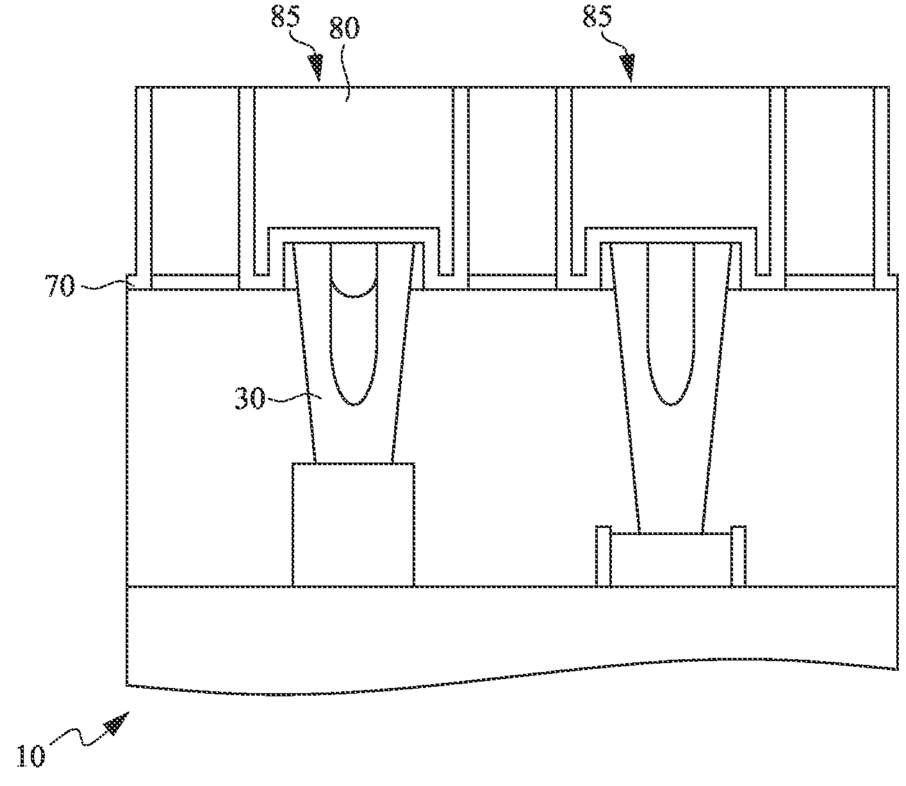

Cross-referencing FIGS. 10 and 15, method 200 may continue at S31 with depositing a conductive material 80 in the trench 65. In exemplary embodiments, the conductive material 80 is a metal, such as copper. Further, method 200 may include, at S33, planarizing the semiconductor device structure 10 to define separate conductive interconnects 85 as shown, with each in electrical contact with an underlying metal structure 30.

Method 200 as described in relation to FIGS. 2-3 and 11-15 forms the conductive interconnect structure 10 of FIG. 15.

In exemplary embodiments, the metal structures 30 are formed during a middle-end-of-the-line (MEOL) process and the conductive interconnects 85 are formed during a backend-of-the-line (BEOL) process where interconnects are formed within the semiconductor device 10.

A method for fabricating a semiconductor device is also provided and includes forming a metal plug having a top surface formed with a seam; depositing a film over the top surface of the metal plug and at least partially filling the seam; and etching the film from over the metal plug, wherein the film remains in the seam.

In certain embodiments, the method includes, after etching the film from over the metal plug, depositing an etch stop layer over the metal plug; forming a layer of dielectric material over the metal plug; etching the layer of dielectric material over the metal plug to form a trench; removing the etch stop layer from over the metal plug; and depositing a conductive material in the trench to form a conductive interconnect in contact with the metal plug.

In certain embodiments of the method, the film is an oxide, nitride, oxynitride, or metal layer.

In certain embodiments of the method, the film has a thickness of from 10 to 100 Angstrom.

In certain embodiments of the method, the metal plug is formed by atomic layer deposition (ALD), chemical vapor deposition (CVD), or physical vapor deposition (PVD).

In certain embodiments of the method, etching the film from over the metal plug comprises performing a wet etching process.

In certain embodiments of the method, the wet etching process is performed with HF, $NH_4F$, $H_3PO_4$, $H_2O$, or molecules containing F or P.

In certain embodiments of the method, the wet etching process is performed with HF, $NH_4F$, $H_3PO_4$, $H_2O$, or molecules containing F or P as an etching medium; with pure $H_2O$, $H_2O$ with $CO_2$, or $H_2O$ with dilute $NH_4$ OH as a cleaning medium; with a drying process selected from spin drying with $N_2$ gas or IPA drying; and with a process temperature of from 20 to 80 degrees C.

In certain embodiments of the method, forming the metal plug comprises forming the metal plug in a dielectric layer; depositing the film over the top surface of the metal plug and at least partially filling the seam comprises depositing the film over the dielectric layer; and, after etching the film from over the metal plug, the film remains over the dielectric layer.

In such embodiments, forming a layer of dielectric material over the metal plug and dielectric layer; etching the layer of dielectric material over the metal plug to form a trench, wherein the film prevents etching of the dielectric layer; and depositing a conductive material in the trench to form a conductive interconnect in contact with the metal plug.

In another embodiment, a method is provided and includes forming a metal structure having a top surface formed with a seam; sealing the seam with a cap; and forming a conductive interconnect over the metal structure.

In certain embodiments of the method, the metal structure is tungsten.

In certain embodiments of the method, the cap is an oxide, nitride, oxynitride, or metal.

In certain embodiments, the method includes depositing an etch stop layer over the metal structure and cap; forming a layer of dielectric material over the etch stop layer; etching the layer of dielectric material over the etch stop layer to form a trench; and removing the etch stop layer from over the metal structure and cap; wherein forming the conductive interconnect over the metal structure comprises depositing a conductive material in the trench.

In certain embodiments of the method, sealing the seam with the cap comprises:

depositing a film over the top surface of the metal structure and at least partially filling the seam; and etching the film from over the metal plug, wherein the film remains in the seam.

In certain embodiments of the method, forming the metal structure comprises forming the metal structure in a dielectric layer; and sealing the seam with the cap comprises depositing a film over the dielectric layer, over the top surface of the metal structure, and at least partially filling the seam, and etching the film from over the metal plug, wherein the film remains in the seam and over the dielectric layer.

In another embodiment, a metal interconnect is provided and includes a metal structure having a top surface and a seam extending from the top surface into the metal structure; a cap located in the seam; and a conductive interconnect located over the metal structure and the cap.

In certain embodiments of the metal interconnect, the metal structure comprises tungsten, the cap comprises $Al_2O_3$, and the conductive interconnect comprises copper.

In certain embodiments of the metal interconnect, the top surface of the metal structure terminates at a lateral sidewall, a liner is located on the lateral sidewall, and the liner and the cap are formed from a same material.

In certain embodiments of the metal interconnect, an air gap is located in the seam under the cap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method comprising:
- forming a metal plug having a top surface formed with a seam, wherein the seam has a seam depth defined as a vertical distance from a deepest point in the seam to the top surface of the metal plug;
- depositing a film over the top surface of the metal plug and at least partially filling the seam; and
- removing the film from over the metal plug to uncover the top surface, wherein a remaining portion of the film remains in the seam, wherein the remaining portion of the film has a vertical height less than the seam depth, and wherein an air gap is enclosed within the seam and under the remaining portion of the film.

2. The method of claim 1, further comprising:
- after removing the film from over the metal plug, depositing an etch stop layer on the metal plug;
- forming a layer of dielectric material over the metal plug;
- etching the layer of dielectric material over the metal plug to form a trench;
- removing the etch stop layer from over the metal plug; and
- depositing a conductive material in the trench to form a conductive interconnect in contact with the metal plug.

3. The method of claim 1, wherein the film is an oxide, nitride, oxynitride, or metal layer.

4. The method of claim 3, wherein the remaining portion of the film has a thickness of from 10 to 100 Angstrom.

5. The method of claim 1, further comprising forming a conductive interconnect directly on the top surface of the metal plug and directly on the remaining portion of the film.

6. The method of claim 1, further comprising forming a conductive interconnect directly on the top surface of the metal plug and directly on the remaining portion of the film, wherein the conductive interconnection comprises a barrier layer directly on the top surface of the metal plug and directly on the remaining portion of the film, and wherein the conductive interconnection comprises a conductive material on the barrier layer.

7. The method of claim 1, further comprising, after removing the film from over the metal plug, depositing an etch stop layer on the metal plug.

8. The method of claim 1, wherein:
- forming the metal plug comprises forming the metal plug in a dielectric layer;
- depositing the film over the top surface of the metal plug and at least partially filling the seam comprises depositing the film over the dielectric layer; and
- after removing the film from over the metal plug, the film remains over the dielectric layer.

9. The method of claim 8, further comprising:
- forming a layer of dielectric material over the metal plug and dielectric layer;
- etching the layer of dielectric material over the metal plug to form a trench, wherein the film prevents etching of the dielectric layer; and
- depositing a conductive material in the trench to form a conductive interconnect in contact with the metal plug.

10. A method comprising:
- forming a metal structure having a top surface formed with a seam, wherein forming the metal structure comprises forming the metal structure in a dielectric layer;
- sealing the seam with a cap, wherein sealing the seam with the cap comprises depositing a film over the dielectric layer, over the top surface of the metal structure, and at least partially filling the seam, and removing the film from over the metal structure, wherein the film remains in the seam and over the dielectric layer; and
- forming a conductive interconnect on the top surface of the metal structure.

11. The method of claim 10, wherein:
- the seam has a seam depth defined as a vertical distance from a deepest point in the seam to the top surface of the metal structure;
- the remaining portion of the film has a vertical height from a lowest end to an uppermost end; and
- the vertical height is equal to the seam depth.

12. The method of claim 10, wherein the metal structure is tungsten.

13. The method of claim 10, wherein the cap is an oxide, nitride, oxynitride, or metal.

14. The method of claim 10, further comprising:
- depositing an etch stop layer over the metal structure and cap;
- forming a layer of dielectric material over the etch stop layer;
- etching the layer of dielectric material over the etch stop layer to form a trench; and removing the etch stop layer from over the metal structure and cap to uncover the top surface of the metal structure;

wherein forming the conductive interconnect on the metal structure comprises depositing a conductive material in the trench.

15. The method of claim 10, further comprising depositing an etch stop layer over the metal structure and cap; and forming a layer of dielectric material over the etch stop layer.

16. The method of claim 10, further comprising depositing an etch stop layer over the metal structure and cap; forming a layer of dielectric material over the etch stop layer; and etching the layer of dielectric material over the etch stop layer to form a trench.

17. A metal interconnect comprising:

a metal structure having a top surface and a seam extending from the top surface into the metal structure, wherein the top surface of the metal structure terminates at a lateral sidewall;

a liner located on the lateral sidewall;

a cap located in the seam, wherein the liner and the cap are formed from a same material; and a conductive interconnect located over the metal structure and the cap.

18. The metal interconnect of claim 17, wherein the metal structure comprises tungsten, the cap comprises $Al_2O_3$, and the conductive interconnect comprises copper.

19. The metal interconnect of claim 17, wherein the conductive interconnect comprises a barrier layer of tantalum nitride or titanium nitride that directly contacts the top surface of the metal structure, and wherein the conductive interconnect comprises a metal overlying and directly contacting the barrier layer.

20. The metal interconnect of claim 17, wherein an air gap is located in the seam under the cap.

* * * * *